United States Patent [19]
Lin et al.

[11] Patent Number: 5,355,380
[45] Date of Patent: Oct. 11, 1994

[54] COMPACT MILLIMETER WAVE SOURCE

[76] Inventors: Shiow-Hwa Lin, 5436 Dalen Ave., San Diego, Calif. 92122; Lawrence H. Sverorup, Jr., 12617 Mustange Dr., Poway, Calif. 92604

[21] Appl. No.: 995,718

[22] Filed: Dec. 23, 1992

[51] Int. Cl.$^5$ ............................................. H01S 3/30
[52] U.S. Cl. ............................................. 372/5; 372/30
[58] Field of Search ............... 372/5, 10, 12, 13, 25, 372/29, 30; 315/3.5, 5, 4

[56] References Cited
U.S. PATENT DOCUMENTS
4,993,033  2/1991  Lin ......................................... 372/30

Primary Examiner—Rodney B. Bovernick
Assistant Examiner—Robert E. Wise
Attorney, Agent, or Firm—John R. Ross

[57] ABSTRACT

A millimeter wave device. Pulses of electrons illuminate a diamond switch at rates of 1 billion to 100 billion pulses per second. The diamond switch connects a high voltage source to a millimeter wave transmitter or other load. In preferred embodiments the electron pulses are provided by a klystron or a traveling wave tube.

3 Claims, 3 Drawing Sheets

COMPACT MILLIMETER WAVE SOURCE

This invention is related to devices for the generation of electromagnetic radiation and in particular for generation of high power millimeter wavelength electromagnetic radiation.

BACKGROUND OF THE INVENTION

Well known methods for producing microwave and millimeter wavelength radiation involve the use of electron tubes which rely on various forms of velocity modulation of an electron beam, followed by a drift section to achieve density bunching. After bunching, the electron kinetic energy is converted into microwave or millimeter waves. In klystrons, this is achieved with two-cavity or multi-cavity arrangements. However, the bandwidth is limited in this case. To achieve wider bandwidths traveling wave velocity modulation is more appropriate. In traveling wave tube amplifiers (TWTA's) electrons interact with the longitudinal electric component of a slow electromagnetic wave. The phase velocity of the electromagnetic wave is slowed down to match the electron velocity, and thereby continuous and cumulative interaction between the electron beam and the wave can take place producing microwaves or millimeter waves over bandwidths as wide as one octave or more. These devices are referred to as slow wave structures. The simplest slow wave structure used in many wide bandwidth TWTA's is the helix waveguide. Bandwidth over one octave is common. Other slow wave structures are also well known.

Electron beam density modulation in a TWTA is characterized by the bunching parameter $\chi$ which is defined by:

$$\chi = \frac{E_o l}{4 V_O} (kl)$$

where $E_o$ is the magnitude of the modulating electric field, $V_o$ is the electron beam voltage, k is the longitudinal wavenumber ($2\pi$/wavelength) of the traveling wave, and l is the length of the TWT. Maximum electron density bunching at the end of the TWT structure occurs for $\chi=1$. At $\chi=1.84$ the bunching is optimum in the sense that the modulated electron beam contains maximum modulation at the fundamental frequency. It is an easy matter to adjust both $E_O$ and l to achieve the desired bunching characteristics.

Traveling wave-tube-amplifier (TWTA) technology is a relatively mature technology which was developed several decades ago. One of the limits of the TWTA is its output power which falls off rapidly as the frequency is increased into the millimeter wave range. Average power of the current state-of-the-an millimeter TWTA ranges from the hundreds of watts to 1 kW.

The applicant has patented a high power fast switch (U.S. Pat. No. 4,993,033) which discloses a diamond switch which is switched on by illumination with a pulsed electron beam. Embodiments disclosed in that patent were expected to produce 10–100 kW pulses at a 10–100 MHz repetition rate. Experiments have demonstrated the operation of such a diamond switch. The switched electric pulse follows the waveform of the illuminating electron beam pulses.

Traditional sources of microwave and millimeter wave radiation have been based on solid state devices or vacuum electron devices. Although solid state devices have shown great promise as the source for various applications, they have generally failed to deliver power greater than several watts and efficiencies greater than a few percent. Vacuum electron devices on the other hand generate greater power with higher efficiency, but they tend to be very bulky. What is needed is a light-weight compact high power (i.e. several kilowatts) microwave source which can operate within the wavelength range from about 3 millimeters to about 300 millimeters or frequencies from 1 GHz to about 100 GHz.

SUMMARY OF THE INVENTION

A beam of electrons containing about 1 billion to 100 billion bunches or pulses per second illuminates a thin diamond target in a diamond switch connecting an output antenna to a high voltage source. Each electron in each pulse creates a large number of electron hole pairs in the diamond. The high voltage bias across the diamond causes very large number of electron-hole pairs to be swept through the diamond target producing a high current surge in less than one half the period of the designed output frequency. The switch is in effect closed while the carriers are being swept through the diamond and it in effect opens when the diamond is substantially clear of carriers. Each surge of current produces an electromagnetic pulse at the output antenna. Thus, an electromagnetic millimeter wave is produced with a frequency equal to the electron beam modulation frequency. In a preferred embodiment the pulsed electron beam is provided by a klystron-like modulation section. In another preferred embodiment the pulsed electron is provided by a TWT-like modulation section.

DETAILED DESCRIPTION OF PREFERRED EMBODIMENTS

Millimeter Wave Diamond Amplifier Concept

Figure 1:
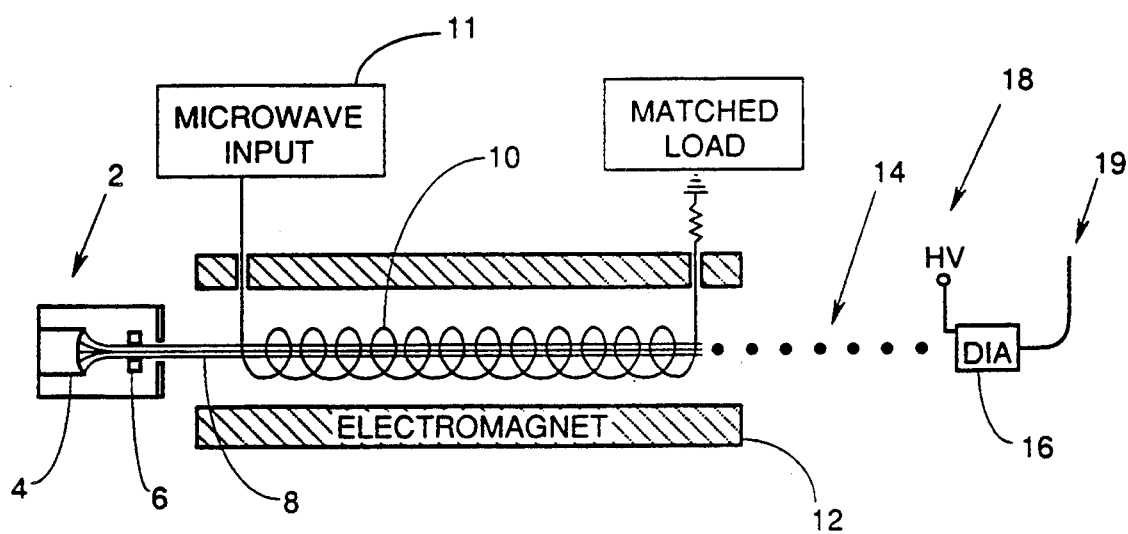
FIG. 1 is a sketch showing the elements of a preferred embodiment of the present invention.

The basic concept of the present invention for producing high power millimeter waves is shown in FIG. 1. As is evident in this drawing the proposed concept exploits the potentials of two different technologies. One is the electron beam velocity modulation and density bunching phenomenon, a well established technique used in all microwave tubes. The other is the high speed, high power capabilities of diamond amplifiers. The concept of a diamond amplifier differs from that of more conventional amplifiers in that the amplification gain comes from carrier generation in response to electron bombardment. The generated carriers are repeatedly swept out of the diamond region creating the high power current pulses. The natural pure single crystal type IIa diamond has the best and the consistent stable properties among the various types of diamond for high speed and high power applications. Single crystal diamond produced through synthetic means can be used as well.

First Preferred Embodiment

TWTA

The device shown in FIG. 1 uses a TWTA as the source of the pulsed electron beam. An electron gun assembly 2 which consists of a thermionic cathode 4 and beam focusing electrodes 6 generates a continuous wave electron beam 8 with beam energy at around 25 keV. The electron beam is directed to a slow wave guide region which consists of a helix waveguide 10 and an electromagnet 12, where velocity modulation and density modulation are achieved through interaction with microwave current in helix coil 10 from microwave input 11. The electrons exiting this interaction section become tightly bunched as shown at 14 with strong modulation at the input microwave frequency. The electron beam is then focused onto the diamond switch 16. These tightly bunched electrons carry the necessary kinetic energy and initiate power amplification in the diamond target through carrier generation. Each electron in the bunch creates about 1500 carrier pairs. The diamond target is biased with a high voltage by high voltage source 18 so that every carrier sweeps through the thin diamond region in less than half the period of the input frequency. The large carrier generation results in a very large gain. The output is transmitted by microwave output antenna 19. In this embodiment the diamond is about 3 microns thick, the high voltage is in the range of about 300 volts. It should produce an output of 1 kilowatt within the range of 26.5 GHz to 40 GHz. Higher output power is possible if higher voltage is applied.

The thermal conductivity of natural type IIa diamond, at 20W/cm/°K., is around five times that of copper at room temperature. The breakdown field for diamond is $10^7$ V/cm and the saturated electron velocity is $2.7 \times 10^7$ cm/sec; these are the highest values among many solid state materials. These parameters can be combined to yield the Johnson figure of merit for the power and frequency performance, and the Keyes figure of merit fox the speed. These figures of merit are respectively 8206 and 32.2 times higher for diamond than they are for silicon for example. It is easy to see that diamond possesses several rather extraordinary properties which are particularly favorable for high power and high speed electronics applications.

Second Preferred Embodiment

Klystron Tube

Figure 2:
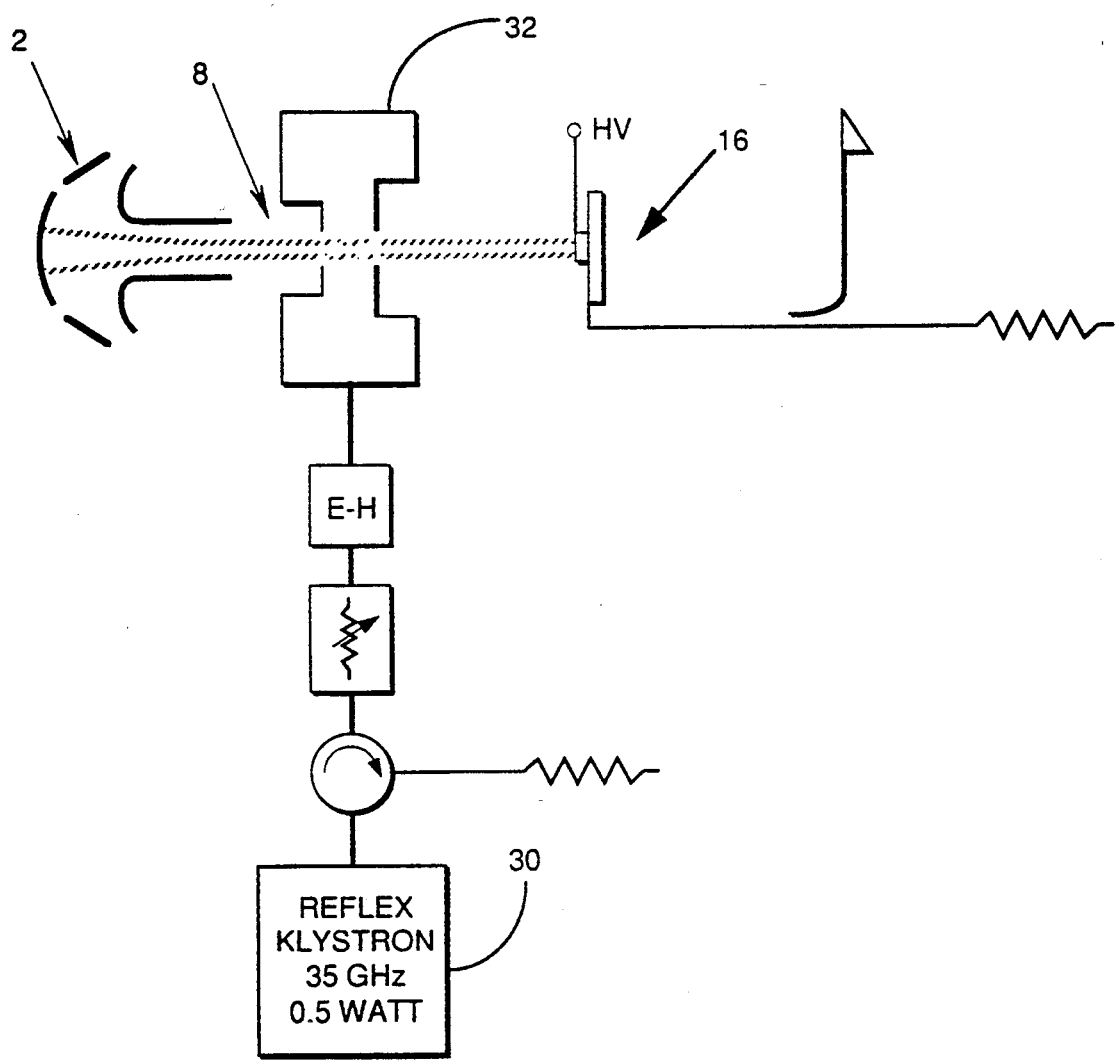
FIG. 2 is a sketch showing another embodiment of the present invention actually built and tested by the Applicant.

Applicants have also completed a series of experiments pertaining to this application using a klystron as the electron beam source. This experiment can be described by reference to FIG. 2. An electron beam welder triode gun 2 is coupled with a reentrant klystron cavity 32 to produce electron bunches at 35 GHz. The electron beam illuminates the diamond switch chip 40. Beam aperture is 0.4 min. Focusing and the alignment of the electron beam through the klystron cavity onto the diamond aperture is achieved through adjustment of both the mechanical support arms and the focusing and the deflection magnetic fields of the triode gun. A typical beam current that is focused through both the buncher cavity and the diamond aperture is 5 mA. With 50 kV electron beam illumination, 5 Amperes were conducted by the diamond switch when 150V bias voltage was applied. The actual current gain is 1000 which is consistent with theoretical anticipation. This represents 750W peak power that can be converted into millimeter wave radiation. A signal gain has been observed with the modulated electron beam bombarding diamond amplifier. The observed gain does depend on the time of arrival of the electron bunch with respect to a "priming" microwave wave signal applied to the output cavity. Such a gain or loss depending on phase would be expected only if a bunched electron beam were in fact interacting with the field in the output cavity. This series of experiments establishes the basic characteristics of this type of device.

Diamond Contacts

The requirements for the diamond contact metallizations are several. The contact must have good adherence and be mechanically rugged and electrically stable. The contact must have sufficient conductivity so that minimal voltage drop is incurred and so that excessive heating during the anticipated current pulses is avoided. The front contact should minimally absorb and backscatter the bombarding electron beam. In addition, the electrical nature of the contact should be "blocking" or "non-injecting" as opposed to "ohmic". This necessity arises from the fact that the carrier lifetimes in the device must be transit time limited. The requirements that the contact be blocking is the most restrictive, and a preferred solution is aluminum overcoated with gold. Tungsten overcoated with gold is another solution.

The Diamond Circuit

The diamond amplifier circuit can be modeled as a current source in parallel with the switch capacitance and the external load. Rise time of the diamond amplifier is affected by the carrier transit time in the diamond gap. With diamond dimension specified at 4 μm thick, 100 μm × 100 μm active area, the transit time is less than the 15 ps, half period of a 35 GHz wave. Maximum power of the diamond amplifier is limited by the space charge limited power flow $P_{sp}$ which is determined by $$P_{sp} = (2V_0 \epsilon \kappa)^2 R \, (E_{max})^2 \left(\frac{A}{d}\right)^2$$

where $V_o$ is the electron saturation velocity, E is the permittivity in free space, K is the relative dielectric constant, R is the load impedance, $E_{max}$ is the breakdown field, A is the switch area, and d is the diamond thickness. After plugging in numbers referred to above, the space charge limited power flow $P_{sp}$ predicted by this formula is 50 kW. A preferred embodiment is designed to produce 35 GHz pulses and is described below.

Figure 3:
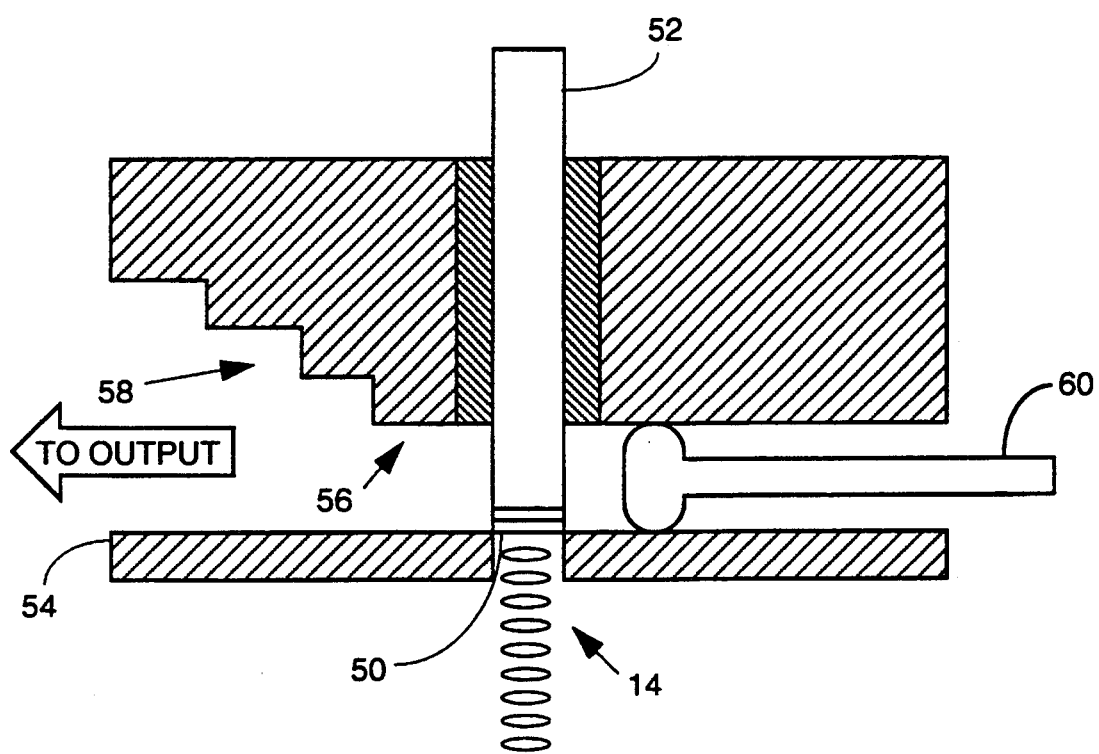
FIG. 3 is a drawing showing in more detail some of the features of the embodiment shown in FIG. 2.

The diamond switch amplifier circuit is shown in more detail in FIG. 3. A voltage source is connected to a diamond chip 50 via a low impedance bias post 52. The diamond switch assembly is mounted at the bottom of waveguide floor 54. Typically the waveguide is transitioned to a reduced height for better impedance matching with the diamond switch assembly as shown at 56. The reduced height waveguide section is impedance transformed to standard height waveguide through an impedance transform section as shown at 58. The bunched electron beam 14 pulses illuminate the diamond switch via a small aperture in the waveguide wall. This causes pulsed carrier movement in diamond switch to form and thus accomplish amplification. The tuning short section 60 is provided for frequency control.

Other Embodiments

While the above description contains many specifics, the reader should not construe these as limitations on the scope of the invention but merely as exemplifications thereof. For example, other sources of pulsed electron beams are known and could be used. The range of the first disclosed embodiment could be extended beyond the limits referred to in order to produce high power microwaves in the range between about 1 MHz to about 1 THz. Many other microwave output devices could be used to transmit the output signal. Accordingly the reader is requested to determine the scope of the invention by their legal equivalents and not by the examples which have been given.

We claim:

1. A millimeter wave device for producing a high power millimeter waves comprising:

(a) a high voltage source, (b) a millimeter wave output means for transmitting the high power millimeter waves, (c) a diamond switch electrically connecting said high voltage source to said millimeter output means, and (d) a pulsed electron beam means for illuminating said diamond switch with a pulsed electron beam of more than 1 billion electron pulses per second, the frequency of said pulsed electron beam defining a pulsed beam frequency, said pulsed electron beam means comprising:

(i) an electron beam means for producing an electron beam and (ii) a bunching means for bunching said electron beam to create said pulsed electron beam:

said millimeter waves being generated by the opening and closing of said diamond switch by said pulsed electron beam at a frequency equal to said pulsed beam frequency.

2. A device as in claim 1 wherein said beam means comprises a klystron.

3. A device as in claim 1 wherein said beam means comprises a traveling wave tube.

* * * * *